(12) United States Patent
Dai

(10) Patent No.: US 11,094,918 B2
(45) Date of Patent: Aug. 17, 2021

(54) PIXEL DEFINING LAYER, DISPLAY SUBSTRATE AND MANUFACTURING METHODS THEREOF

(71) Applicant: BOE Technology Group Co., Ltd., Beijing (CN)

(72) Inventor: Qing Dai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/411,456

(22) Filed: May 14, 2019

(65) Prior Publication Data
US 2020/0044180 A1    Feb. 6, 2020

(30) Foreign Application Priority Data

Aug. 6, 2018 (CN) .......................... 201810883573.1

(51) Int. Cl.
| | | |
|---|---|---|
| H01L 51/52 | (2006.01) | |
| H01L 27/32 | (2006.01) | |
| H01L 51/00 | (2006.01) | |
| H01L 51/56 | (2006.01) | |

(52) U.S. Cl.
CPC ........ *H01L 51/529* (2013.01); *H01L 27/3246* (2013.01); *H01L 27/3283* (2013.01); *H01L 51/0003* (2013.01); *H01L 51/0026* (2013.01); *H01L 51/56* (2013.01); *H01L 2227/323* (2013.01); *H01L 2251/303* (2013.01); *H01L 2251/5369* (2013.01); *H01L 2251/556* (2013.01)

(58) Field of Classification Search
CPC ............. H01L 27/3246; H01L 51/0026; H01L 51/529; H01L 27/3283; H01L 51/0003; H01L 51/56; H01L 2251/556; H01L 2251/303; H01L 2227/323; H01L 2251/5369
See application file for complete search history.

(56) References Cited

U.S. PATENT DOCUMENTS

| | | | |
|---|---|---|---|
| 2016/0221017 A1* | 8/2016 | Huang | .................... C23C 14/12 |
| 2017/0279049 A1 | 9/2017 | Dai | |
| 2019/0206946 A1 | 7/2019 | Xu et al. | |

FOREIGN PATENT DOCUMENTS

| | | |
|---|---|---|
| CN | 103490018 A | 1/2014 |
| CN | 105218999 A | 1/2016 |
| CN | 105774279 A | 7/2016 |
| CN | 107046106 A | 8/2017 |

(Continued)

OTHER PUBLICATIONS

First office action of Chinese application No. 201810883573.1 dated Mar. 27, 2020.

*Primary Examiner* — Thanh T Nguyen
(74) *Attorney, Agent, or Firm* — Fay Sharpe LLP

(57) ABSTRACT

The present disclosure provides a pixel defining layer, a display substrate and manufacturing methods thereof, and relates to the field of display technology. The pixel defining layer is located on a base substrate, and configured to define a plurality of pixel regions. The pixel defining layer includes: a defining layer body, and a heat generating substance located in the defining layer body. The heat generating substance is configured to cause a temperature on a side of the defining layer body proximal to the base substrate to be lower than a temperature on a side of the defining layer body distal from the base substrate.

13 Claims, 2 Drawing Sheets

(56) References Cited

FOREIGN PATENT DOCUMENTS

| | | |
|---|---|---|
| CN | 108172602 A | 6/2018 |
| JP | 2006236744 A | 9/2006 |
| WO | WO-2019205594 A1 * 10/2019 | ........... G03F 7/0047 |

* cited by examiner

PIXEL DEFINING LAYER, DISPLAY SUBSTRATE AND MANUFACTURING METHODS THEREOF

CROSS-REFERENCE TO RELATED APPLICATION

This application claims priority to Chinese Patent Application No. 201810883573.1, filed on Aug. 6, 2018 and entitled "PIXEL DEFINING LAYER, DISPLAY SUBSTRATE, AND MANUFACTURING METHODS THEREOF", the entire contents of which are incorporated herein by reference.

TECHNICAL FIELD

The present disclosure relates to display technology, and in particular, relates to a pixel defining layer, a display substrate and manufacturing methods thereof.

BACKGROUND

Usually, a wet film-forming process such as an inkjet printing process is used to manufacture a display device such as an organic light-emitting diode (OLED) and a liquid crystal display (LCD). The organic solution is printed in a pixel region defined by the pixel defining layer and then dried to form a pixel layer. During drying, due to the solute migration and interface pinning effect caused by the Marangoni convection inside the organic solution, the pixel layer will exhibit a coffee ring in which the edge of the pixel layer is thicker than the center thereof, which may affect the light emitting performance of the pixel layer.

In the related art, a specific amount of surfactant is added into the organic solution to change the surface tension differences among different portions of the organic solution, so as to reducing the Marangoni convection and finally improving the thickness uniformity of the pixel layer.

SUMMARY

On this basis, the present disclosure provides a pixel defining layer, a display substrate and manufacturing methods thereof, including the following technical solutions.

In one aspect, the embodiments of the present disclosure provide a pixel defining layer, wherein the pixel defining layer is located on a base substrate and configured to define a plurality of pixel regions; wherein the pixel defining layer comprises a defining layer body, and a heat generating substance located in the defining layer body, and wherein the heat generating substance is configured to cause a temperature on a side of the defining layer body proximal to the base substrate to be lower than a temperature on a side of the defining layer body distal from the base substrate.

Optionally, the heat generating substance is configured to cause a temperature difference between the side of the defining layer body proximal to the base substrate and the side of the defining layer body distal from the base substrate to be greater than 30° C.

Optionally, the heat generating substance is distributed in the entire defining layer body, and a content of the heat generating substance on the side proximal to the base substrate is lower than a content of the heat generating substance on the side distal from the base substrate.

Optionally, the heat generating substance is only distributed on the side of the defining layer body distal from the base substrate.

Optionally, the heat generating substance comprises at least one of magnetic nanoparticles and photothermic nanoparticles.

Optionally, the magnetic nanoparticles are superparamagnetic.

Optionally, the magnetic nanoparticles are $\gamma$-$Fe_2O_3$ nanoparticles.

Optionally, a mass percentage of the heat generating substance in the pixel defining layer is ≤5%.

Optionally, the heat generating substance is $\gamma$-$Fe_2O_3$ nanoparticles, and a mass percentage of the heat generating substance in the pixel defining layer is ≤5%; and wherein the heat generating substance is distributed in the entire defining layer body, and a content of the heat generating substance on the side proximal to the base substrate is lower than a content of the heat generating substance on the side distal from the base substrate.

In another aspect, the embodiments of the present disclosure provide a display substrate, and the display substrate comprises a base substrate, wherein the display substrate further comprises:

any pixel defining layer as mentioned previously and being located on the base substrate; and a pixel layer located within a pixel region defined by the pixel defining layer.

Optionally, the heat generating substance is configured to cause a temperature difference between the side of the defining layer body proximal to the base substrate and the side of the defining layer body distal from the base substrate to be greater than 30° C.

Optionally, the heat generating substance is distributed in the entire defining layer body, and a content of the heat generating substance on the side proximal to the base substrate is lower than a content of the heat generating substance on the side distal from the base substrate.

Optionally, the heat generating substance is only distributed on the side of the defining layer body distal from the base substrate.

Optionally, the heat generating substance comprises at least one of magnetic nanoparticles and photothermic nanoparticles.

Optionally, the magnetic nanoparticles are superparamagnetic.

In yet another aspect, the embodiments of the present disclosure provide a method for manufacturing a pixel defining layer, comprising:

providing a base substrate; and forming a pixel defining layer on the base substrate by using a raw material for manufacturing the pixel defining layer, wherein the pixel defining layer comprises a defining layer body, and a heat generating substance located in the defining layer body, and wherein the heat generating substance is configured to cause a temperature on a side of the defining layer body proximal to the base substrate to be lower than a temperature on a side of the defining layer body distal from the base substrate.

Optionally, the forming a pixel defining layer on the base substrate by using a raw material for manufacturing the pixel defining layer comprises:

providing a raw material solution, the raw material solution comprising a defining layer body raw material and the heat generating substance;

coating the raw material solution on the base substrate to form a wet film;

drying the wet film, and inducing the heat generating substance in the wet film to migrate to the side distal from the base substrate, to obtain a cured film layer; and exposing and developing the cured film layer to obtain the pixel defining layer.

Optionally, the forming a pixel defining layer on the base substrate by using a raw material for manufacturing the pixel defining layer comprises:

forming the defining layer body on the base substrate by using a defining layer body raw material;

forming a cavity on the side of the defining layer body distal from the base substrate; and filling a raw material solution comprising the defining layer body raw material and the heat generating substance into the cavity, drying the raw material solution, and forming a cured film body in the cavity to obtain the pixel defining layer.

In yet still another aspect, the embodiments of the present disclosure provide a method for manufacturing a display substrate, comprising:

providing a base substrate;

forming a pixel defining layer on the base substrate by using any method as mentioned previously;

filling a pixel layer raw material solution into a pixel region defined by the pixel defining layer; and causing the heat generating substance in the pixel defining layer to generate heat, and drying the pixel layer raw material solution to obtain a cured pixel layer.

Optionally, the heat generating substance is magnetic nanoparticles, and the heat generating substance is induced to generate heat by applying an electromagnetic field to the pixel defining layer.

BRIEF DESCRIPTION OF THE DRAWINGS

To describe the technical solutions in the embodiments of the present disclosure more clearly, a brief introduction on the accompanying drawings required for describing the embodiments is as follows. Apparently, the accompanying drawings in the following description show merely some embodiments of the present disclosure, and a person of ordinary skill in the art may still obtain other drawings from these drawings without creative efforts.

Figure 1:
FIG. 1 is a schematic structural view of one pixel defining layer according to the embodiments of the present disclosure.

Reference numerals and denotations thereof are as follows:

1—base substrate;
201—defining layer body; 202—heat generating substance; 203—defining layer body raw material;
3—cavity; and
4—mask plate.

DETAILED DESCRIPTION

The aspects of the present disclosure will be described in further detail, to present the technical solutions and advantages of the present disclosure more clearly.

In one aspect, the embodiments of the present disclosure provide a pixel defining layer. The pixel defining layer is located on a base substrate, and configured to define a plurality of pixel regions. The pixel defining layer includes a defining layer body and a heat generating substance located in the defining layer body. The heat generating substance is configured to cause a temperature on a side of the defining layer body proximal to the base substrate to be lower than a temperature on a side of the defining layer body distal from the base substrate.

The pixel defining layer according to the embodiments of the present disclosure may be used for the manufacture of a pixel layer. By inducing the heat generating substance to generate heat, the temperature on the side of the defining layer body proximal to the base substrate could be caused to be lower than the temperature on the side of the defining layer body distal from the base substrate, and thus a corresponding temperature difference exists in the pixel layer raw material solution within the pixel region. With this temperature difference, a liquid flow direction caused by surface tension redistribution is opposite to a Marangoni convection direction caused by concentration gradient in the pixel layer raw material solution. This helps to effectively resist the climbing effect of a solute in the pixel layer raw material solution towards an edge, thereby improving the thickness uniformity of the pixel layer. It can be seen that, by using the pixel defining layer according to the embodiments of the present disclosure to manufacture the pixel layer, the addition of an additive for resisting the coffee ring phenomenon into the raw material solution of the pixel layer is avoided, thereby ensuring that the basic performance of the pixel layer is not affected, and simplifying the manufacturing process of the pixel layer.

However, in the related art, a surfactant may be added into an organic solution to avoid the coffee ring phenomenon, which would not only affect the basic performance of the pixel layer, but also impose a higher requirement on a suitable solvent.

It can be understood that, the defining layer body involved in the embodiments of the present disclosure is a pixel defining layer commonly used in the related art. Compared with the pixel defining layer in the prior art, in the pixel defining layer according to the embodiments of the present disclosure, a heat generating substance having the above functions is additionally added in a specific content.

It has been reported that, in a drying process of the pixel layer raw material solution, due to an interaction among the compensated flow of droplets in the pixel region from the center to the edge, Marangoni convection of the droplets from the edge to the center, and the pinning effect at the contact line between the droplets and interface, the phenomenon of coffee ring with a thicker edge and thinner center (i.e., climbing phenomenon) appears during the drying process of the droplets upon forming a dried film. As such, it is hard to ensure the flatness of the formed thin film, thereby leading to a non-uniform luminance of the final display device product and a lowered utilization rate of the pixel layer raw materials.

According to the embodiments of the present disclosure, the heat generating substance is added to the defining layer body to adjust the temperature gradient between the side of the pixel defining layer proximal to the base substrate (which may be defined as a bottom portion) and the side of the pixel defining layer distal from the base substrate (which may be defined as a top portion). In this way, the temperature gradient in droplets proximal to the edge of the defining layer body is adjusted, such that the temperature at the top portion of the droplets is higher than the temperature at the bottom portion of the droplets. In this case, a lower surface tension is formed at the top portion and a higher surface tension is formed at the bottom portion, such that a Marangoni flow direction thereof is changed from the top portion to the bottom portion (that is, from the center to the edge). In this case, the flow direction is opposite to a compensation flow direction resulted by a concentration gradient (the concentration is high at the edge but low at the center), such that the climbing effect of a solute in the pixel layer raw material solution towards an edge could be effectively resisted, thereby improving the thickness uniformity of the pixel layer.

When the pixel defining layer according to the embodiments of the present disclosure is used for manufacturing an organic light-emitting diode, since a climbing degree at the edge of the pixel layer during the film formation is reduced, film formation flatness of the entire pixel layer is improved, such that efficiency and life time of the organic light-emitting diode are effectively enhanced.

For the sake of an optimal effect in preventing the solute from climbing towards the edge, in the embodiments of the present disclosure, the heat generating substance is configured to cause a temperature difference between the side of the defining layer body proximal to the base substrate (for example, the bottom portion) and the side of the defining layer body distal from the base substrate to be greater than 30° C. For example, the temperature difference between the two sides may be 30° C., 35° C., 40° C., 45° C. or the like.

It should be noted that the above temperature difference may be obtained by measuring the temperature at the topmost portion and the temperature at the bottommost portion of the defining layer body.

By controlling the content distribution of the heat generating substance in the defining layer body, different temperature differences may be caused in the defining layer body by the heat generating substance. The content of the heat generating substance positively correlates with the temperature formed by the heat generating substance in the defining layer body. In addition, considering that no adverse impact is caused to the performance of the pixel defining layer per se, that is, the defining layer body, and subsequent light emitting performance of the display device is not affected, a mass percentage of the heat generating substance in the pixel defining layer is less than or equal to 5%, for example, 1%, 2%, 2.5%, 3%, 3.5%, 4%, 4.5%, 5% or the like.

To obtain a desired temperature difference, an orthogonal experiment may be carried out before manufacture. For example, a defining layer body for test may be provided. The heat generating substance is distributed in the defining layer body. Temperature sensors are separately arranged at the top portion and the bottom portion of the defining layer body for test, such that a temperature difference between the top portion and the bottom portion may be measured. In the orthogonal experiment, when the content of the heat generating substance in the defining layer body is determined, the resultant temperature difference may be changed by changing the heating time. Alternatively, when the heating time is determined, the resultant temperature difference may be changed by changing the content of the heat generating substance in the defining layer body. Through this, it is determined, for a desired temperature difference, how to distribute the heat generating substance in the defining layer body. A result of the orthogonal experiment may be used to instruct formal manufacture of the pixel defining layer to obtain the desired temperature difference.

Figure 2:
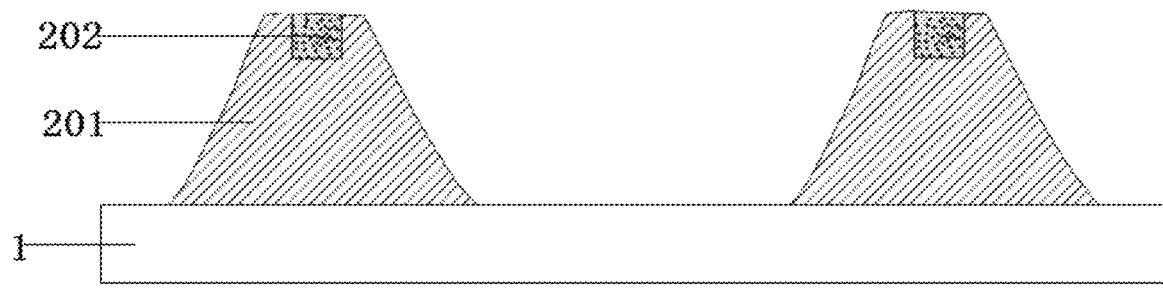
FIG. 2 is a schematic structural view of another pixel defining layer according to the embodiments of the present disclosure.

To ensure that the temperature on the side of the defining layer body proximal to the base substrate is lower than the temperature on the side of the defining layer body distal from the base substrate, in one possible implementation manner (1), the heat generating substance 202 is distributed inside the entire defining layer body 201, and the content of the heat generating substance 202 on the side proximal to the base substrate 1 is lower than the content of the heat generating substance 202 on the side distal from the base substrate 1. Exemplary distribution of the heat generating substance may be found in FIG. 1. In another possible implementation manner (2), the heat generating substance 202 is only distributed on the side of the defining layer body 201 distal from the base substrate 1. Exemplary distribution of the heat generating substance may be found in in FIG. 2.

With respect to the above implementation manner (1), the distribution of the heat generating substance may be achieved by the following method.

Firstly, a raw material solution is provided, wherein the raw material solution includes a defining layer body raw material having a specific composition, and a heat generating substance. Secondly, the raw material solution is coated on the base substrate to form a wet film. Thirdly, the wet film is dried, and the heat generating substance is induced in the wet film to migrate to the side distal from the base substrate to obtain a cured film layer. Finally, the cured film layer is exposed and developed to form desired pixel regions such that the pixel defining layer is obtained.

The heat generating substance in the wet film is induced to migrate such that the distribution of the heat generating substance changes in the wet film. In this way, the content of the heat generating substance is differently distributed in the defining layer body. For example, during volatilization of a solvent in the wet film (that is, in the drying and curing process), an external magnetic field may be applied at the same time, such that the heat generating substance is fixed in the drying and curing process of the wet film.

A fashion of inducing the heat generating substance to migrate is selected based on the properties of the heat generating substance. For example, when the heat generating substance is magnetic, an external magnetic field may be applied for inducement; and when the heat generating substance has electric charges, an external electrical field may be applied for inducement.

With respect to the above implementation manner (2), the distribution of the heat generating substance may be practiced by the following method.

Firstly, the defining layer body is formed on the base substrate by using the defining layer body raw material. Secondly, a cavity is formed on the side of the defining layer body distal from the base substrate. Then, a raw material solution including the defining layer body raw material and the heat generating substance is filled into the cavity, the raw material solution is dried, and a cured film body is formed in the cavity to obtain the pixel defining layer.

Here, the defining layer body involved in this implementation manner is directly manufactured by using the defining layer body raw material, which contains no heat generating substance (which may be the same as the composition of the pixel defining layer in the prior art). In addition, the defining layer body has defined a plurality of pixel regions through exposure and development.

By arranging the cavity on one side of the defining layer body and manufacturing the pixel defining layer including the heat generating substance in the cavity, the pixel defining layer desired in the embodiments of the present disclosure could be formed.

Based on the position of the heat generating substance in the defining layer body, the position, size and distribution of the cavity (cavities) in the defining layer body are determined. For example, a cavity having a depth that is ⅕ to ⅓ of the thickness of the defining layer body may be arranged at a middle position at the top portion of the defining layer body.

Figure 3:
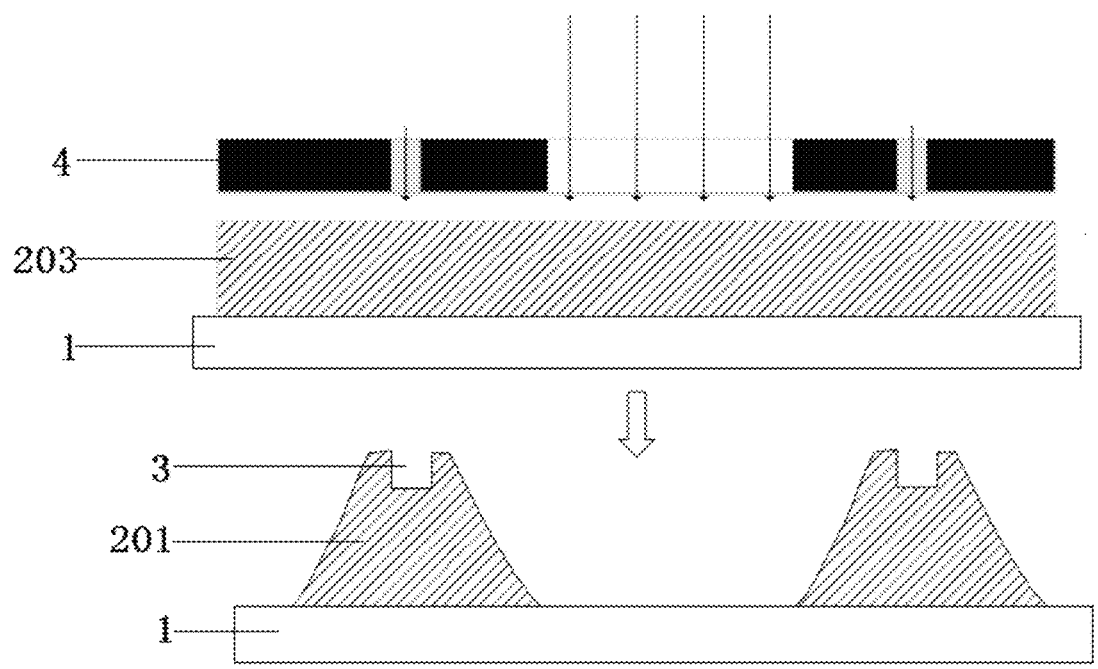
FIG. 3 is a schematic view of manufacturing process of the pixel defining layer according to the embodiments of the present disclosure.

In one possible example, the cavity may be arranged on one side of the defining layer body in the following way: as illustrated in FIG. 3, during forming the defining layer body 201 on the base substrate 1 by using the defining layer body raw material 203, a mask plate 4 having a specific grayscale may be used such that the portion of the formed defining layer body 201 corresponding to the pixel region position is entirely exposed, and the portion of the formed defining layer body 201 corresponding to the position of the cavity 3 is partially exposed (the grayscale of the grayscale region of the mask plate 4 is determined based on the depth of the cavity 3). After the defining layer body 201 is formed, the cavity 3 is also formed.

In one possible example, by means of printing or spray coating, a raw material solution including the defining layer body raw material and the heat generating substance may be filled into the cavity. Subsequently, the solvent therein is removed by drying. In this way, a cured film body containing the heat generating substance may be formed. Here, the cured film body is combined with the wall of the cavity, such that the pixel defining layer desired in the embodiment of the present disclosure is formed.

Here, the heat generating substance includes at least one of magnetic nanoparticles and photothermic nanoparticles. By magnetic or photothermic manner to generate heat, temperature differences are formed a different positions of the defining layer body.

Since the magnetic nanoparticles have the advantages of high heating efficiency, high heating speed, good operability and the like, the magnetic nanoparticles may be used as the heat generating substance. The magnetic nanoparticles may have a particle size of less than 30 nm, further, less than 20 nm.

Further, the magnetic nanoparticles are superparamagnetic. The magnetic nanoparticles may be superparamagnetic, that is, no hysteresis characteristics exists and there is no residual magnetism, thus it would not affect the light-emitting performance of the display substrate as manufactured For example, the magnetic nanoparticles may be $\gamma$-$Fe_2O_3$ nanoparticles, which, under an external magnetic field, would heat the surrounding defining layer body due to the magnetic-induced heat generation effect. When the $\gamma$-$Fe_2O_3$ nanoparticles have a particle size of less than 30 nm, they will show a superparamagnetic property. In a possible example, $\gamma$-$Fe_2O_3$ nanoparticles having a particle size of less than 30 nm are used as the heat generating substance, and the mass percentage thereof in the pixel defining layer may be controlled within 5%.

In one possible example, in the pixel defining layer according to the embodiments of the present disclosure, the heat generating substance is $\gamma$-$Fe_2O_3$ nanoparticles, and the mass percentage thereof in the pixel defining layer is ≤5%. The heat generating substance is distributed in the entire defining layer body, and a content of the heat generating substance on the side proximal to the base substrate is lower than a content of the heat generating substance on the side distal from the base substrate.

With respect to the photothermic nanoparticles, as one example, they may be gold nanoparticles, polypyrrole nanoparticles (which are also referred to as PPy nanoparticles), cuprous sulfide nanoparticles or the like.

In another aspect, the embodiments of the present disclosure further provide a method for manufacturing a pixel defining layer. The manufacturing method includes: providing a base substrate; forming a pixel defining layer on the base substrate by using a raw material for manufacturing the pixel defining layer. The formed pixel defining layer includes: a defining layer body and a heat generating substance located in the defining layer body. The heat generating substance is configured to cause a temperature on a side of the defining layer body proximal to the base substrate to be lower than a temperature on a side of the defining layer body distal from the base substrate.

As known from the above disclosure, based on specific distribution of the heat generating substance, the pixel defining layer may be obtained by different methods, which is exemplarily described hereinafter.

As one example, the method for manufacturing a pixel defining layer includes: providing a raw material solution including a defining layer body raw material and the heat generating substance;

coating the raw material solution on the base substrate to form a wet film;

drying the wet film, and inducing (for example, by using an external electromagnetic field) the heat generating substance in the wet film to migrate to the side distal from the base substrate to obtain a cured film layer; and exposing and developing the cured film layer to obtain the pixel defining layer.

As another example, the method for manufacturing a pixel defining layer includes: forming the defining layer body on the base substrate by using a defining layer body raw material;

forming a cavity on the side of the defining layer body distal from the base substrate; and filling a raw material solution including the defining layer body raw material and the heat generating substance into the cavity, drying the raw material solution, and forming a cured film body in the cavity to obtain the pixel defining layer.

The defining layer body involved in this example is directly manufactured using the defining layer body raw material, which does not contain heat generating substance (which may have the same composition as the pixel defining layer in the related art). In addition, the defining layer body has defined a plurality of pixel regions through exposure and development.

In still another aspect, the embodiments of the present disclosure further provide a display substrate. The display substrate includes: a base substrate; a pixel defining layer located on the base substrate; and a pixel layer located within a pixel region defined by the pixel defining layer.

As the above pixel defining layer is used, when the pixel layer is formed in the pixel region, by inducing the heat generating substance to generate heat, the temperature on the side of the defining layer body proximal to the base substrate could be caused to be lower than the temperature on the side of the defining layer body distal from the base substrate, and thus a corresponding temperature difference exists in the pixel layer raw material solution within the pixel region. With this temperature difference, a liquid flow direction caused by surface tension redistribution is opposite to a Marangoni convection direction caused by concentration gradient in the pixel layer raw material solution. This helps to effectively resist the climbing effect of a solute in the pixel layer raw material solution towards an edge, thereby improving the thickness uniformity of the pixel layer and further improving the light-emitting performance of the display substrate.

It can be understood by those skilled in the art that, the above-mentioned base substrate may include: a base and a functional film layer located on the base. Taking a thin film crystal light-emitting device as an example, the base substrate as used may include a thin film crystal diode and an anode layer disposed on the film crystal diode. Alternatively, taking a quantum dot light-emitting device as an example, the base substrate as used may include a transparent conductive electrode base, and sequentially laminated thereon a hole transporting layer, a quantum dot light-emitting layer, an electron transporting layer, and a metal electrode.

In yet still another aspect, the embodiments of the present disclosure further provide a method for manufacturing a display substrate. The manufacturing method includes:

providing a base substrate;

forming a pixel defining layer on the base substrate by using the above method for manufacturing a pixel defining layer;

filling a pixel layer raw material solution into a pixel region defined by the pixel defining layer; and causing the heat generating substance in the pixel defining layer to generate heat, and drying the pixel layer raw material solution to obtain a cured pixel layer.

Exemplarily, filling the pixel layer raw material solution into the pixel regions defined by the pixel defining layer may include: filling the pixel layer raw material solution into the pixel regions by inkjet printing.

A heating manner is selected based on the heat generating property of the heat generating substance. For example, when the heat generating substance is magnetic nanoparticles, an electromagnetic field is applied to the pixel defining layer to cause the heat generating substance, that is, the magnetic nanoparticles, to generate heat.

In one possible example, said causing the heat generating substance in the pixel defining layer to generate heat, and drying the pixel layer raw material solution to obtain a cured pixel layer may include:

transferring the base substrate which is filled with the pixel layer raw material solution to a film-forming drying device, and applying an alternating electromagnetic field to the pixel defining layer in a direction parallel to the horizontal surface of the base substrate such that the heat generating substance therein generates heat.

After the electromagnetic field is applied for a defined time period, when it is determined that the temperature difference between the top portion and the bottom portion of the pixel layer is greater than 30° C., decompression drying is carried out to form a film and hence to form the pixel layer in the pixel region. It can be observed by naked eyes that, the climbing degree at the edge of the thin film of the pixel layer is remarkably lowered.

Figure 4:
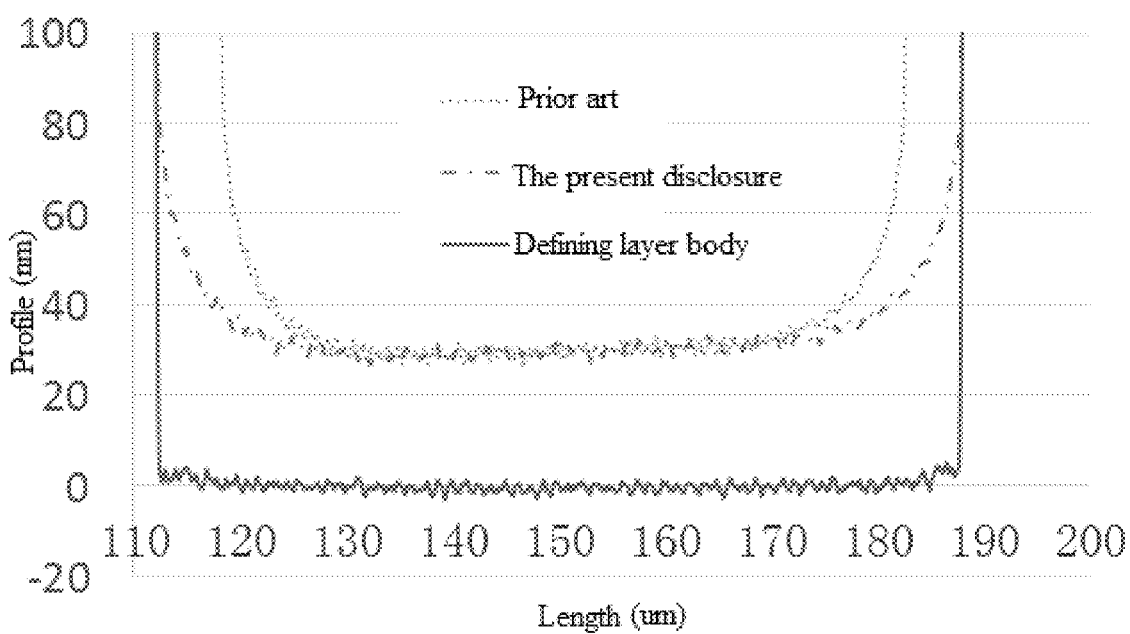
FIG. 4 is a profile topography of pixel defining layers manufactured by using different methods according to the embodiments of the present disclosure.

Further, as illustrated in FIG. 4, through tests, as compared with a conventional pixel defining layer without the addition of heat generating substance, in the pixel layer manufactured using the pixel defining layer according to the embodiments of the present disclosure, the edge climbing degree is significantly reduced.

The foregoing descriptions are only for the purpose of facilitating understanding of the technical solutions of the present disclosure, and are not intended to limit the present disclosure. Any modifications, equivalent substitutions, improvements, etc. made within the spirit and principles of the present disclosure, shall fall into the protection scope of the present disclosure.

What is claimed is:

1. A pixel defining layer, the pixel defining layer being located on a base substrate and configured to define a plurality of pixel regions; wherein the pixel defining layer comprises a defining layer body and a heat generating substance, and a cavity is provided on a side, distal from the base substrate, of the defining layer body, and the heat generating substance is in the cavity;

wherein the heat generating substance is configured to cause a temperature on a side of the defining layer body proximal to the base substrate to be lower than a temperature on a side of the defining layer body distal from the base substrate, and a mass percentage of the heat generating substance in the pixel defining layer is <5%.

2. The pixel defining layer according to claim 1, wherein the heat generating substance is configured to cause a temperature difference between the side of the defining layer body proximal to the base substrate and the side of the defining layer body distal from the base substrate to be greater than 30° C.

3. The pixel defining layer according to claim 1, wherein the heat generating substance comprises at least one of magnetic nanoparticles and photothermic nanoparticles.

4. The pixel defining layer according to claim 3, wherein the magnetic nanoparticles are superparamagnetic.

5. The pixel defining layer according to claim 3, wherein the magnetic nanoparticles are $\gamma$-$Fe_2O_3$ nanoparticles.

6. A display substrate, the display substrate comprising a base substrate, wherein the display substrate further comprises:

the pixel defining layer as defined in claim 1 and being located on the base substrate; and a pixel layer located within a pixel region defined by the pixel defining layer.

7. The display substrate according to claim 6, wherein the heat generating substance is configured to cause a temperature difference between the side of the defining layer body proximal to the base substrate and the side of the defining layer body distal from the base substrate to be greater than 30° C.

8. The display substrate according to claim 6, wherein the heat generating substance comprises at least one of magnetic nanoparticles and photothermic nanoparticles.

9. The display substrate according to claim 8 wherein the magnetic nanoparticles are superparamagnetic.

10. A method for manufacturing a pixel defining layer, comprising:

providing a base substrate; and forming a pixel defining layer on the base substrate by using a raw material for manufacturing the pixel defining layer, wherein the pixel defining layer comprises a defining layer body and a heat generating substance, and a cavity is provided on a side, distal from the base substrate, of the defining layer body, and the heat generating substance is in the cavity;

wherein the heat generating substance is configured to cause a temperature on a side of the defining layer body proximal to the base substrate to be lower than a temperature on a side of the defining layer body distal from the base substrate, and a mass percentage of the heat generating substance in the pixel defining layer is <5%.

11. The method for manufacturing a pixel defining layer according to claim 10, wherein the forming a pixel defining layer on the base substrate by using a raw material for manufacturing the pixel defining layer comprises:

forming the defining layer body on the base substrate by using a defining layer body raw material;

forming the cavity on the side of the defining layer body distal from the base substrate; and filling a raw material solution comprising the defining layer body raw material and the heat generating substance into the cavity, drying the raw material solution, and forming a cured film body in the cavity to obtain the pixel defining layer.

12. A method for manufacturing a display substrate, comprising:

providing a base substrate;

forming a pixel defining layer on the base substrate by using the method as defined in claim 10;

filling a pixel layer raw material solution into a pixel region defined by the pixel defining layer; and causing the heat generating substance in the pixel defining layer to generate heat, and drying the pixel layer raw material solution to obtain a cured pixel layer.

13. The method for manufacturing a display substrate according to claim 12, wherein the heat generating substance is magnetic nanoparticles, and the heat generating substance is induced to generate heat by applying an electromagnetic field to the pixel defining layer.

\* \* \* \* \*